US008471606B2

(12) United States Patent
Clements

(10) Patent No.: US 8,471,606 B2
(45) Date of Patent: Jun. 25, 2013

(54) DRIVER CIRCUIT FOR A SEMICONDUCTOR POWER SWITCH

(75) Inventor: Neal D. Clements, Fargo, ND (US)

(73) Assignee: Deere & Company, Moline, IL (US)

( * ) Notice: Subject to any disclaimer, the term of this patent is extended or adjusted under 35 U.S.C. 154(b) by 30 days.

(21) Appl. No.: 13/170,211

(22) Filed: Jun. 28, 2011

(65) Prior Publication Data

US 2012/0212262 A1    Aug. 23, 2012

Related U.S. Application Data

(60) Provisional application No. 61/445,626, filed on Feb. 23, 2011.

(51) Int. Cl.
*H03K 19/01* (2006.01)
*H03K 19/0175* (2006.01)
(52) U.S. Cl.
CPC ............ *H03K 19/01* (2013.01); *H03K 19/0175* (2013.01)
USPC .............. 327/109; 327/63; 327/108; 327/333
(58) Field of Classification Search
USPC ............................. 327/333, 108, 109; 326/63
See application file for complete search history.

(56) References Cited

U.S. PATENT DOCUMENTS

| 4,511,835 | A | 4/1985 | Studtmann |
| 4,540,922 | A | 9/1985 | Horvath et al. |
| 5,170,155 | A | 12/1992 | Plus et al. |
| 5,510,731 | A * | 4/1996 | Dingwall ........................ 326/63 |
| 5,914,582 | A | 6/1999 | Takamoto et al. |
| 6,331,941 | B1 | 12/2001 | Smith |
| 7,560,972 | B1 * | 7/2009 | Tiew et al. ..................... 327/333 |
| 7,834,573 | B2 | 11/2010 | Lindsey et al. |
| 2006/0247829 | A1 | 11/2006 | Sato |
| 2009/0284999 | A1 | 11/2009 | Gibbs et al. |
| 2010/0060222 | A1 | 3/2010 | Kezobo et al. |

* cited by examiner

*Primary Examiner* — Temesgh Ghebretinsae
*Assistant Examiner* — James J Sterling

(57) ABSTRACT

A driver circuit for controlling a semiconductor power switch comprises a first power driver transistor and a second power driver transistor complementary to the first power driver transistor. Both power driver transistors have an output terminal connected to an input terminal of the semiconductor power switch. An input terminal of the second power driver transistor is connected to a half bridge circuit comprising a first pre-driver transistor and a second pre-driver transistor complementary to the first pre-driver transistor. Both first and second pre-driver transistors have an output terminal connected to the input terminal of the second power driver transistor. This provides fast switching times with low power consumption for the pre-driver transistors.

7 Claims, 1 Drawing Sheet

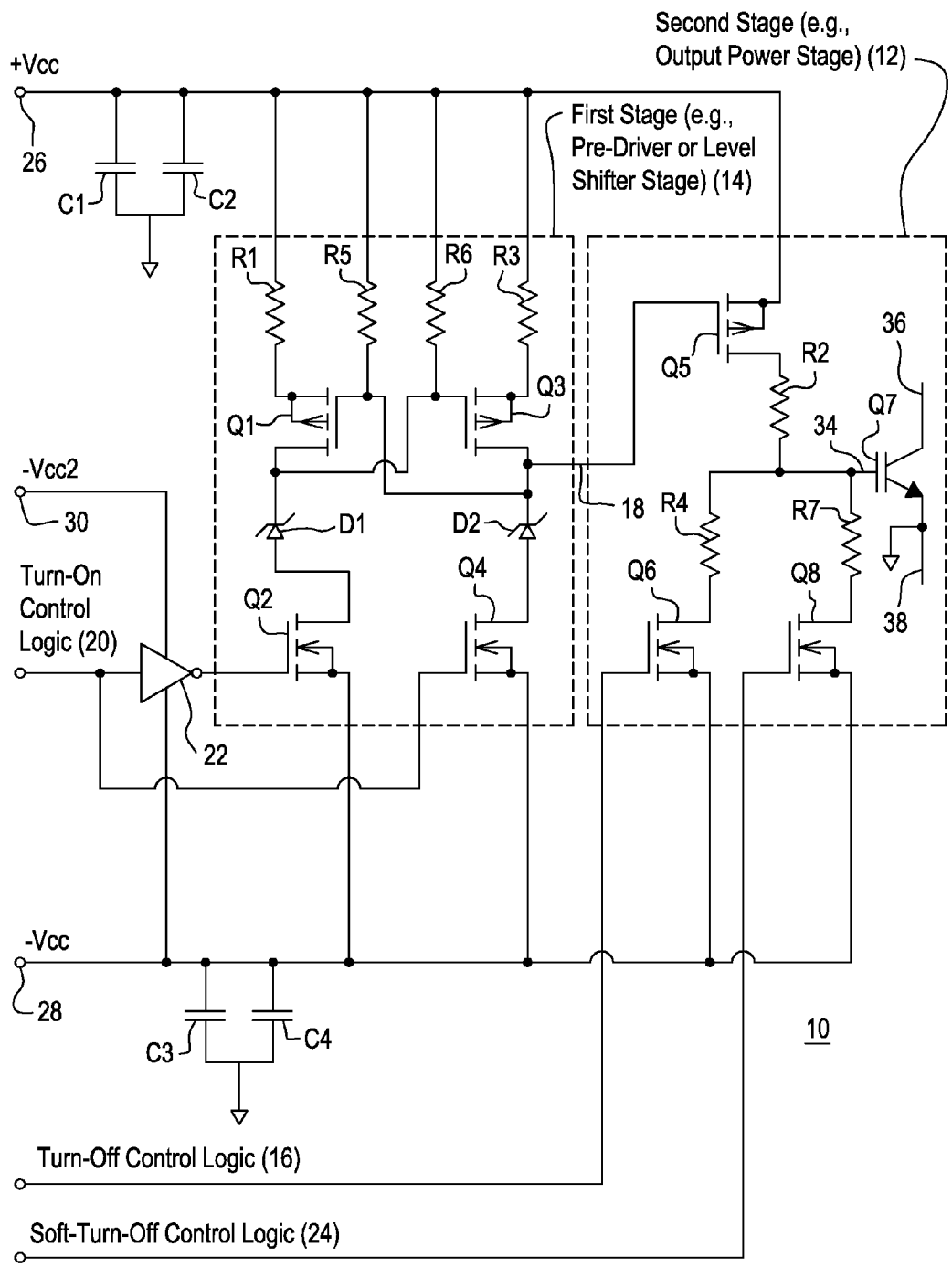

DRIVER CIRCUIT FOR A SEMICONDUCTOR POWER SWITCH

This document claims priority based on U.S. provisional application Ser. No. 61/445,626, filed on 23 Feb. 2011 and entitled DRIVER CIRCUIT FOR A SEMICONDUCTOR POWER SWITCH, under 35 U.S.C. 119(e).

FIELD OF THE INVENTION

This invention relates to a driver circuit for a semiconductor power switch.

BACKGROUND OF THE INVENTION

Electrical loads, which are driven with relatively high electric power, are sometimes controlled by electronic control circuits that make use of semiconductor power switches. A typical example for such an electronic control circuit is an inverter that generates an alternating voltage from a direct current for driving an electric motor. The power switches are usually metal-oxide semiconductor, field-effect transistors (MOSFET's) or insulated-gate bipolar transistors (IGBT's).

Two types of gate driver circuits for controlling the main power switches of the electronic control circuit are commonly used, bipolar and complementary. The bipolar gate drivers suffers from poor voltage utilization, speed limitations, and difficulty in applying different turn-on versus turn-off output resistances. The complementary configuration gate driver overcomes these problems, but a translation from logic level signals (e.g., 0 and 5 volts) to the correct levels is needed to drive a driver transistor (e.g., driver output transistor). A simple resistor and P-channel MOSFET inverter is typically used for this purpose as a pre-driver in conjunction with a voltage limiter, but this pre-driver is either slow with low power consumption or fast with high power consumption depending on design choices.

Thus, there is a need for a pre-driver circuit for driving a power driver controlling a semiconductor power switch that provides fast switching speed with low power consumption.

SUMMARY OF THE INVENTION

In accordance with one embodiment, a driver circuit for controlling a semiconductor power switch comprises a first power driver transistor and a second power driver transistor complementary to the first power driver transistor. The first and second power driver transistors each have an output terminal connected to an input terminal of the semiconductor power switch. An input terminal of the second power driver transistor is connected to a half bridge circuit comprising a first pre-driver transistor and a second pre-driver transistor complementary to the first pre-driver transistor. Both first and second pre-driver transistors have an output terminal connected to the input terminal of the second power driver transistor.

BRIEF DESCRIPTION OF THE DRAWINGS

FIG. 1 is an electronic circuit diagram of an electronic control circuit with a semiconductor power switch and a driver circuit.

DESCRIPTION OF THE PREFERRED EMBODIMENT

An electronic control circuit 10 shown in FIG. 1 comprises a first stage 14 (e.g., a pre-driver or level shifter stage) and a second stage 12 (e.g., output power stage), among other circuit elements. In one embodiment, the electronic control circuit 10 comprises an inverter that generates an alternating voltage from the direct current for driving a load connected to the second stage 12.

The output stage 12 comprises a semiconductor power switch Q7. For example, the semiconductor power switch Q7 may be embodied in the form of an insulated-gate bipolar transistor (IGBT) (as illustrated in FIG. 1), a bipolar transistor, a MOSFET, a thyristor, silicon controlled rectifier (SCR), or another suitable semiconductor device or arrangement of semiconductor devices. An output terminal 36 (e.g., collector or emitter) of the semiconductor power switch Q7 is connected to an electric load, such as a motor (e.g., an alternating current motor, an induction motor, or permanent magnet motor). Another terminal 38 of the semiconductor power switch Q7 (e.g., emitter or collector) is connected to a DC power source (both not shown). In one embodiment, a gate drive circuit can uses the emitter of Q7 as its ground reference.

As illustrated in FIG. 1, an input terminal 34 (e.g., gate or base) of semiconductor power switch Q7 is connected by a resistor R4 to the output terminal (e.g., drain or electrode) of a first power driver transistor Q6. For example, the first power driver transistor Q6 may comprise an enhancement type N-channel MOSFET, as shown. The source of Q6 is connected to a negative supply voltage 28 (e.g., -Vcc). The negative supply voltage 28 can be any suitable value (e.g., -8 VDC) with respect to ground. An input terminal (gate) of Q6 is directly connected to a first input 16 of the electronic control circuit 10.

In one embodiment, an input terminal 34 (e.g., gate or base) of semiconductor power switch Q7 is connected by a resistor R7 to the output terminal (e.g., drain or electrode) of a power driver transistor Q8. For example, the first power driver transistor Q8 may comprise an enhancement type N-channel MOSFET, as shown. The source of Q8 is connected to a negative supply voltage 28 (e.g., Vcc). An input terminal (gate) of Q8 is directly connected to a second input 24 of the electronic control circuit 10.

The input terminal 34 (gate) of Q7 is also connected by a resistor R2 to an output terminal (drain) of a second power driver transistor Q5. For example, the second power driver transistor may comprise an enhancement type P-channel MOSFET Q5. The source of Q5 is connected to a positive supply voltage 26 (e.g., +Vcc). The positive supply voltage 26 can be any suitable value (e.g., +14 VDC) with respect to ground. The direct current (DC) supply voltage (+Vcc) is buffered or isolated from ground by capacitors C1 and C2. The direct current (DC) supply voltage -Vcc is buffered or isolated from ground by capacitors C3 and C4. An input terminal (gate) of Q5 is connected to an output 18 of the first stage 14 (e.g., pre-driver and level shifter circuit). Together, transistors Q5 and Q6 make up a complementary power driver for the semiconductor power switch Q7.

The first stage 14 (e.g., pre-driver and level shifter circuit) comprises a first (or output) pre-driver transistor Q3. For example, the first pre-driver transistor Q3 may comprise an enhancement type P-channel MOSFET having an output terminal (drain) connected to output 18 and a source connected via a resistor R3 to the positive supply voltage (+Vcc). Output 18 is further connected to the cathode of a voltage limiting diode D2 (e.g., a Zener diode, the anode of which connected to the output terminal (drain) of a second (lower) pre-driver transistor Q4. For example, the second pre-driver transistor Q4 may comprise in an enhancement type N-channel MOSFET having a source connected to the negative power supply terminal 28 (−Vcc). In one embodiment, the voltage limiting diode D2 may comprise a Zener diode with a suitable voltage rating relative to the positive and negative supply voltage, such as 15 VDC breakdown voltage.

A first pre-pre-driver transistor Q1 has a source connected to the positive supply voltage 26 (+Vcc) by a resistor R1 and an output terminal (drain) connected to the cathode of another voltage limiting diode D1 (e.g., a Zener diode). The voltage limiting diode D1 has an anode connected to the output terminal (drain) of a second pre-pre-driver transistor Q2. Here, the first pre-pre-driver transistor Q1 may comprise an enhancement type P-channel MOSFET and the second pre-pre-driver transistor Q2 may comprise an enhancement type N-channel MOSFET having a source connected to negative supply voltage 28 (−Vcc). An input terminal (gate) of Q1 is directly connected to output 18 and by a resistor R5 to the positive supply voltage 26 (+Vcc). An input terminal (gate) of the first pre-driver transistor Q3 is connected by a resistor R6 to the positive supply voltage 26 (+Vcc) and directly to the output terminal (drain) of the first pre-pre-driver transistor Q1.

The input terminal (gate) of the second pre-driver transistor Q4 is directly connected to a second input 20 of the electronic control circuit 10. The second input 20 is also connected to an input terminal of a logic inverter 22. An output terminal of logic inverter 22 is connected to an input terminal (gate) of the second pre-pre-driver transistor Q2. The logic inverter 22 is connected to a supply voltage 30 (e.g., −Vcc2) that can be in any suitable value (e.g., −3V with respect to ground, which may correspond to +5V with respect to −Vcc). The second supply voltage input of logic inverter 22 may be connected to −Vcc. Here, the logic inverter is supplied with a suitable differential voltage (e.g., 5V transistor-to-transistor logic (TTL) voltage).

The inputs 16 and 20 are normally driven with complementary (inverted) logic (TTL) signals with respect to −Vcc. While the two logic signals on inputs 16 and 20 cannot be both simultaneously high, they however can both be low. A second off channel is also provided with a third input 24 connected to the input terminal (gate) of a third power driver transistor Q8 in the form of an enhancement type N-channel MOSFET, having a source connected to the negative supply voltage 28 (e.g., −Vcc) and an output terminal (drain) connected via a resistor R7 having a higher resistance than R4 to the input (gate) of Q7. This second off channel is used to turn Q7 off more slowly during high current faults than via input 16 to avoid overvoltage of Q7 due to high current change speeds during turn-off. Only one of the three logic inputs 16, 20, 24 is normally high. Thus, if the first input 16 is logic zero or a low logic level (e.g., 0V with respect to −Vcc), the second input 20 is logic one or a high logic level (e.g., +5V with respect to −Vcc). In this case, the first power driver transistor Q6 is off. On the other hand, the gate of the second driver transistor Q4 is on +5V with respect to the negative supply voltage 28 (−Vcc) and thus Q4 is on, switching output 18 to +7V with respect to ground, and thus switching the second power driver transistor Q5 and hence the semiconductor power switch Q7 and finally the load on. The output of the logic inverter 22 is 0V with respect to the negative supply voltage 28 (−Vcc). Thus, Q2 is off, while Q1 is on because output 18 and thus the gate of Q1 is on +7V with respect to ground. Since Q1 is on, the gate of Q3 is on +Vcc and thus Q3 is off.

On the other hand, if the first input 16 is logic one (+5V with respect to −Vcc), the second input 20 is zero (0V with respect to −Vcc). In this case, the first power driver transistor Q6 is on. On the other hand, the gate of the second driver transistor Q4 is on 0V with respect to −Vcc and thus Q4 is off. The output of the logic inverter 22 is +5V with respect to −Vcc. Thus, Q2 is on, bringing the source of Q1 and the gate of Q3 to +7V with respect to ground. Consequently, Q3 is on, such that output 18 is on +Vcc, switching the second power driver transistor Q5 and hence the semiconductor power switch Q7 and finally the load off. Q1 is then also off. The same is true when the third input 24 is on logic one.

The first pre-driver transistor Q3 and the second pre-driver transistor Q4 together make up a complementary half bridge (e.g., first complementary half bridge) for driving the output 18 of first stage (e.g., the pre-driver and level shifter circuit). The complementary half bridge is advantageous in the above described situations, or different operating modes, where no high steady state power dissipation is required to bring output 18 to a low potential, but allows a fast transition between the described states. The first pre-pre-driver transistor Q1 and the second pre-pre-driver transistor Q2 together make up another complementary half bridge (e.g., a second complementary half bridge) for controlling the input terminal (gate) of the first pre-driver transistor Q3. This also requires no high steady state power dissipation for bringing the control input of the first pre-driver transistor Q3 to a low potential, but allows for a high switching speed. The pull-up resistor R3 can be sized based on the switching speed requirement for Q5 rather than power dissipation and is typically sufficiently small. The output resistance of the complementary half bridge, composed of Q3, Q4, can be made sufficiently low in both on and off stages and can thus drive the second power driver transistor Q5 much faster than conventional solutions with a single transistor and resistor.

The complementary half bridge of the first stage 14 supports lower output impedance or lower output resistance in both the on and off states at output terminal 18 to facilitate fast and efficient driving of the second stage 12 (e.g., at power driver transistor Q5). Because the first and second pre-driver transistors (e.g., transistors Q3 and Q4, respectively) each have an output terminal (e.g., drain) coupled to the input terminal of the second power driver transistor (e.g., transistor Q5), where Q4 is coupled via the voltage limiting diode D2, the driver circuit of the first stage 14 facilitates relatively fast switching times with low power consumption for the pre-driver transistors.

Having described the preferred embodiment, it will become apparent that various modifications can be made without departing from the scope of the invention as defined in the accompanying claims.

The following is claimed:

1. A driver circuit for controlling a semiconductor power switch, the driver circuit comprising:
   a first power driver transistor and a second power driver transistor, complementary to the first power driver transistor; the first and second power driver transistors having an output terminal connected to an input terminal of the semiconductor power switch, where the semiconductor power switch comprises a bipolar junction transistor for driving an electric motor;
   an input terminal of the second power driver transistor is connected to a half bridge circuit comprising a first pre-driver transistor and a second pre-driver transistor, complementary to the first pre-driver transistor; the first and second pre-driver transistors having an output terminal connected to the input terminal of the second power driver transistor;

a voltage limiter connected between outputs of the first pre-driver transistor and the second pre-driver transistor; and a resistor coupled to a source terminal of the first pre-driver transistor, where the resistance is sized based on a switching speed requirement for the second power driver transistor.

2. The driver circuit as claimed in claim 1 wherein an input terminal of the first pre-driver transistor is connected to a half bridge circuit comprising a first pre-pre-driver transistor and a second pre-pre-driver transistor complementary to the first pre-pre-driver transistor, both first and second pre-pre-driver transistors having an output terminal connected to the input terminal of the first pre-driver transistor.

3. The driver circuit as claimed in claim 2 wherein an input terminal of the second pre-driver transistor is directly connected to an input of the driver circuit, the input also connected to a logic inverter having its output connected to an input terminal of the second pre-pre-driver transistor.

4. The driver circuit as claimed in claim 2 wherein an input terminal of the first pre-pre-driver transistor is connected to the output terminal of the first pre-driver transistor.

5. The driver circuit as claimed in claim 1 wherein the first pre-driver transistor is a P-channel metal-oxide-semiconductor field-effect transistor and the second pre-driver transistor is an N-channel metal-oxide-semiconductor field-effect transistor.

6. The driver circuit as claimed in claim 2 wherein the first pre-pre-driver transistor is a P-channel metal-oxide semiconductor field-effect transistor and the second pre-pre-driver transistor is an N-channel metal-oxide-semiconductor field-effect transistor.

7. The driver circuit as claimed in claim 1 wherein the first power driver transistor is an N-channel metal-oxide semiconductor field-effect transistor and the second power driver transistor is a P-channel metal-oxide semiconductor field-effect transistor.

* * * * *